United States Patent [19]

Steeb

[11] Patent Number: 4,610,843
[45] Date of Patent: Sep. 9, 1986

[54] LOW-ALLOY (NI-SN-TI) COPPER ALLOY

[75] Inventor: Jörg Steeb, Tiefenbach, Fed. Rep. of Germany

[73] Assignee: Wieland-Werke AG, Ulm, Fed. Rep. of Germany

[21] Appl. No.: 684,563

[22] Filed: Dec. 21, 1984

[30] Foreign Application Priority Data

Dec. 30, 1983 [DE] Fed. Rep. of Germany ....... 3347535

[51] Int. Cl.$^4$ .............................. C22C 9/02; C22C 9/06
[52] U.S. Cl. ..................................... 420/473; 420/488; 420/492
[58] Field of Search ............... 420/470, 473, 488, 492; 148/412, 433, 11.5 C, 12.7 C, 13.2, 160

[56] References Cited

U.S. PATENT DOCUMENTS 4,337,089 6/1982 Arita et al. ..................... 148/11.5 C
4,366,117 12/1982 Tsuji .................................. 420/481

FOREIGN PATENT DOCUMENTS 104596 8/1979 Japan ................................. 420/473

Primary Examiner—L. Dewayne Rutledge
Assistant Examiner—Robert L. McDowell
Attorney, Agent, or Firm—Flynn, Thiel, Boutell & Tanis

[57] ABSTRACT

A low-alloyed copper alloy suitable for use as a base material for a semiconductor includes 0.03 to 0.2% nickel by weight, 0.03 to 0.2% tin by weight; and 0.015 to 0.1% titanium by weight, the remainder being copper and common impurities.

4 Claims, 1 Drawing Figure

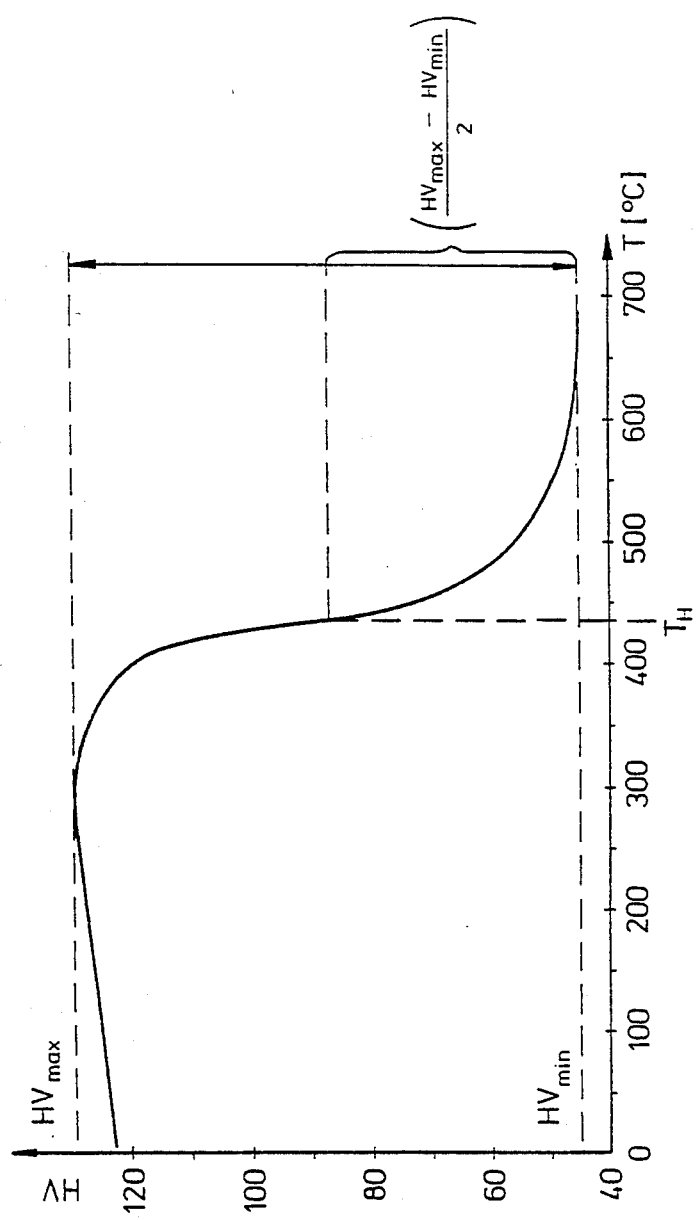

LOW-ALLOY (NI-SN-TI) COPPER ALLOY

FIELD OF THE INVENTION

This invention relates to a low-alloyed copper alloy, a method for its manufacture, and a use therefor.

BACKGROUND OF THE INVENTION

There exists a great need for copper alloy for electrical purposes where, aside from high solidity and high electrical conductivity, resistance against softening and oxidation is needed. These alloys are needed as base materials for semiconductors, for example for transistors or integrated circuits. Base materials for semiconductors must have certain characteristics:

(a) The mechanical solidity must be sufficiently high so that an inherent stability of the base is assured during manufacture, during transport, and when equipping it with electronic structural elements. The hardness should therefore lie, if possible, above 125 HV (Vickers hardness). On the other hand, the flexibility of the material must be sufficient so that the small connecting legs do not break off during repeated back and forth bending. Usually, a three-time bending corresponding with German industrial standard (DIN) 50153 is here requested.

(b) The material must resist softening, so that the steps which are needed during the semiconductor manufacture and which are carried out at a high temperature do not result in a loss of the hardness and inherent stability. A measure for the softening resistance is the so-called semi-hardness temperature $T_H$, which is obtained from a softening curve (which in graphical form is the Vickers hardness HV plotted as a function of the annealing temperature T). The semi-hardness temperature $T_H$ is thereby associated with the value:

$$HV_{min.} + \frac{(HV_{max} - HV_{min})}{2}.$$

A thermal stress occurs during fastening of the semiconductor component on the base, when the adhesive is hardened or a eutectic reaction is caused between the silicon element and the gold coating of the base. Furthermore, high temperatures occur during the connection of the semiconductor component to the small connecting legs with so-called bonding wires and during pressing of the complete component into plastic. During these manufacturing steps, temperatures of up to 400° C. can occur over a time period of 1 hour. Therefore, no noticeable softening should be recognized in the semiconductor base materials below 350° to 400° C.

(c) The electrical and thermal conductivity should be as high as possible so that power loss created during operation of the silicon semiconductor can be discharged in the form of heat and in this manner a self-destruction of the component is prevented. In order to assure the heat discharge to the necessary degree, the electrical conductivity should, as much as possible, lie above 80% IACS. (100% IACS corresponds with 58.00 m/OHM x mm²).

(d) The material must be substantially resistant to oxidation of its surface so that, during the manufacturing steps which take place at an elevated temperature, the smallest possible oxide cover on the base surface is created, thereby assuring that the adhesion between the silicon component, the bond wires and the plastic mass does not deteriorate. For the mentioned use, copper-iron alloys, for example CDA 194, have previously been used to a great degree. These materials have sufficient hardness and good bending behavior and a substantial oxidation stability, but the electrical conductivity is approximately 60 to 70% IACS so that, in the case of high-performance semiconductors, sufficient heat dissipation does not exist. Other low-alloyed materials, as for example CuZnO 0.15, CuSnO 0.12, or CuFeO 0.1, do achieve an electrical conductivity above 80% IACS, but due to the high copper content, have at higher temperatures a tendency toward greater surface oxidation. A low-alloyed CuNiSn-alloy with 0.03 to 0.5% Ni and 0.03 to 0.5% Sn according to Japanese Published Application No. 48-19425 does have sufficient electrical conductivity, but only a relatively low semi-hardness temperature.

Furthermore, it is known that, upon occurrence of the usual contamination, strong variations in characteristics can occur in low-alloyed materials.

SUMMARY OF THE INVENTION

Therefore, a basic purpose of the invention is to provide a copper alloy which, aside from high solidity and an electrical conductivity above 80% IACS, has sufficient softening resistance. A further purpose involves finding a combination in which the oxidation susceptibility is not higher than in common materials and the characteristics of which are moreover substantially insensitive to the usual amounts of contamination.

This purpose is attained inventively by providing a copper alloy comprising:
  0.03 to 0.2% nickel by weight;
  0.03 to 0.2% tin by weight; and
  0.015 to 0.1% titanium by weight; the remainder being copper and common impurities.
Preferably the copper alloy comprises:
  0.03 to 0.06% nickel by weight,
  0.03 to 0.06% tin by weight; and
  0.015 to 0.03% titanium by weight.

In one embodiment of the invention, the nickel, tin and titanium components exist in the relationship of a:b:c, where a is in the range of 1.8 to 2.2, b is in the range of 1.8 to 2.2 and c is in the range of 0.9 to 1.1.

In another embodiment of the invention, the nickel, tin and titanium exist in the relationship of a:b:c of 2:2:1.

The inventive addition of titanium to a CuNiSn-alloy leads to a nickel-containing, tin-containing, titanium-containing phase separation, the solubility of which in the matrix is sufficiently small so that the electrical conductivity has approximately the same values as in the case of additions of equal amounts of nickel and tin, nickel and titanium, or tin and titanium. The electrical conductivity of the inventive alloy is between 80 and 90% IACS.

The existence of the NiSnTi-containing phase separation is known from a multi-component copper, nickel, tin, titanium chromium-containing alloy (German Patent No. 2 948 916), but not its favorable influence on the softening resistance of low-alloyed copper alloys. In particular, the NiSnTi-containing phase increases the semi-hardness temperature more than equal amounts of nickel and tin, nickel and titanium, or tin and titanium.

Furthermore, the NiSnTi-containing phase has a relatively high chemical stability, so that common impurities have a relatively small influence on certain characteristics, such as electrical and thermal conductivity. It is therefore not necessary to use purer additives than is commonly necessary in other alloys.

Furthermore, it was found, surprisingly, that the inventive alloy, in spite of the high copper content, does not have any higher oxidation tendency than copper materials with a higher alloy content, as for example an Cu-Fe-alloy which corresponds with CDA 194.

The manufacture of the inventive alloy can be effected in a manner common for naturally hard alloys, since the NiSnTi-containing phase is separated without the quenching which is usually necessary in separation-hardening alloys so that electrical conductivity is increased to an optimum value and softening is hindered.

The inventive copper alloys can be cast in the usual manner. To achieve favorable characteristic combinations, the alloy, after casting, preferably is (a) homogenized at temperatures of 850 to 950° C. between 1 and 24 hours.

(b) hot rolled at temperatures of 600 to 800° C. in one or more passes, and (c) cooled off to room temperature with a cooling-off speed of between 10° C./min. and 2000° C./min.

It is advisable to carry out the method step b at 650° to 750° C., and the method step c with a cooling-off speed of between 50° C./min and 1000° C./min. According to a preferred embodiment of the method, the method step c includes a cold-deformation of up to 99.9% which is carried out in one or more passes. Between the cold-rolling passes, it is possible to anneal the alloy, preferably for achieving an inventive, uniform dispersion of the separation phase up to a maximum of 10 h.

For a maximum electrical conductivity, annealing as a band in a bell-type annealing furnace at temperatures of 350° to 500° C., or continuously in a continuous furnace at temperatures of 400° to 550° C., is advisable.

A tempering treatment preferably follows the last cold-rolling pass.

The copper alloy can inventively be utilized as a base material for semiconductors, in particular transistors or integrated circuits.

BRIEF DESCRIPTION OF THE DRAWING

To explain the terms softening and semi-hardness temperature $T_H$, the drawing depicts a graph of a softening curve. The Vickers hardness HV is thus plotted with respect to the annealing temperature T. After determining the hardness maximum $HV_{max}$ and the hardness minimum $HV_{min}$, the semi-hardness temperature $T_H$ has the value:

$$HV_{min.} + \frac{(HV_{max} - HV_{min})}{2}.$$

EXAMPLES

Example 1

Table 1 illustrates the composition of an inventive alloy (No. 7) and of 6 comparison alloys with Sn, Ni and Ti, Ni and Ti, Sn and Ni, or Sn and Ti added (information being given in percentage by weight):

TABLE 1

| Experiment Identification | Composition of the experimental alloys | | | |
|---|---|---|---|---|
| | Sn | Ni | Ti | Cu |
| 1 | n.n. | 0.0615 | n.n. | Remainder |
| 2 | 0.0726 | n.n. | n.n. | Remainder |
| 3 | n.n. | n.n. | 0.0427 | Remainder |
| 4 | n.n. | 0.0626 | 0.0480 | Remainder |
| 5 | 0.0627 | 0.0695 | n.n. | Remainder |
| 6 | 0.0676 | n.n. | 0.0442 | Remainder |
| 7 | 0.0470 | 0.0565 | 0.0283 | Remainder | n.n. = cannot be detected

The alloys were manufactured in the following manner. The electrolytic copper was melted, together with cathode nickel and fine tin, in an induction furnace at approximately 1200° C. under a charcoal layer. After the complete dissolving of the same, Ti in the form of a suitable key alloy CuTi was added. The key alloy contained 28% titanium in a pure form. After dissolving of the CuTi, the melt was cast in an iron mold having the dimensions 25×50×100 mm. The blocks were homogenized for 1 hour at 900° C. The cooling off of the band strips occurred continuously in air. Subsequently, band strips of 0.75 mm thickness were manufactured therefrom through cold rolling, a final annealing for 1 hour at 500° C., and subsequent pickling in diluted $H_2SO_4$. The final rolling was, for all experiments, uniformly 96.6%. After the tempering, the semi-hardness temperature $T_H$ and electrical conductivity were determined. The results are shown in Table 2.

TABLE 2

| Electrical conductivity and semi-hardness $T_H$ of the inventive alloy (No. 7) and the comparison alloys (Nos. 1 to 6). | | |
|---|---|---|
| Experiment Identification | Electrical Conductivity (% IACS) | Semi-hardness Temp. $T_H$ °C. (1 hour annealing time) |
| 1 | 92 | 150 |
| 2 | 94 | 340 |
| 3 | 97 | 175 |
| 4 | 81 | 400 |
| 5 | 90 | 325 |
| 6 | 82 | 375 |
| 7 | 83 | 420 |

The listed values show the surprisingly improved characteristics of the inventive copper alloy. The inventive alloy (No. 7) has, when compared for example with the comparison alloy Nos. 4 and 6, a higher semi-hardness temperature and an increased electrical conductivity. The alloy Nos. 1, 2, 3, and 5 do have a higher electrical conductivity, but cannot be utilized for the mentioned application because of a softening resistance which is too low.

Example 2

This example focuses on the relatively low oxidation tendency of the inventive alloy in spite of a high copper content.

Table 3 illustrates the composition of two inventive alloys (Nos. 7 and 8) in comparison to a common CuFe 2, 4 alloy (CDA 194).

TABLE 3

| | Composition of the experimental alloys (information being given in percentage by weight); | | | | | | |
|---|---|---|---|---|---|---|---|
| Experiment Identification | Sn | Ni | Ti | Fe | Zn | P | Cu |
| 7 | 0.0470 | 0.0565 | 0.0283 | n.n. | n.n. | n.n. | Remainder |
| 8 | 0.0864 | 0.0881 | 0.0455 | n.n. | n.n. | n.n. | Remainder |
| CDA 194 | n.n. | n.n. | n.n. | 2.4 | 0.12 | 0.03 | Remainder |

The alloys 7 and 8 were manufactured as described in Example 1. The conventional CuFe band material (CDA 194) was manufactured in a conventional manner.

Band strips with the dimensions 20×40 mm were degreased in trichloroethane, pickled in diluted $H_2SO_4$, thoroughly rinsed, and carefully dried. After the oxidizing of the sample pieces, which are accessible openly on all sides, in the air furnace, the weight increase relative to the entire surface was determined. The following annealing treatments were chosen:

(a) A heat treatment for 4 hours at 200° C. should simulate the embedding of the completed base elements in a plastic mass.

(b) An annealing for 1 minute at 500° C. represented the thermal requirement during the connecting of the silicon semiconductor to the base band through the formation of an $Au_3$ Si-eutecticum.

(c) An annealing for 5 minutes at 700° C. should give information regarding the scaling during heating up to a hot-rolling temperature.

TABLE 4

| Weight increase in $10^{-1}$ mg/cm$^2$ in dependence on the annealing conditions in air | | | |
|---|---|---|---|
| Annealing Conditions | Experiment Identification | | |
| | 7 | 8 | CDA 194 |
| 4 h/200° C. | 0.059 | 0.058 | 0.117 |
| 1 min/500° C. | 0.232 | 0.298 | 0.236 |
| 5 min/700° C. | 4.03 | 3.56 | 3.77 |

According to this, it is established that the weight increase of the inventive alloy can be approximately equated with that of a common CuFe 2, 4 alloy (CDA 194).

I claim:

1. A low-alloyed copper alloy, consisting of
    0.03 to 0.2% nickel by weight;
    0.03 to 0.02% tin by weight; and
    0.015 to 0.1% titanium by weight; the remainder being copper and common impurities, said alloy having an electrical conductivity of at least 80% IACS.

2. The copper alloy according to claim 1, wherein said copper alloy has:
    0.03 to 0.06% nickel by weight;
    0.03 to 0.06% tin by weight; and
    0.015 to 0.03% titanium by weight.

3. The copper alloy according to claim 1, wherein said nickel, tin and titanium components exist in the relationship of a : b : c, where a is in the range of 1.8 to 2.2, b is in the range of 1.8 to 2.2 and c is in the range of 0.9 to 1.1.

4. The copper alloy according to claim 3, wherein said nickel, tin and titanium exist in the relationship of a : b : c of 2 : 2 : 1.

* * * * *